United States Patent [19]

Bol

[11] Patent Number: 5,151,153

[45] Date of Patent: Sep. 29, 1992

[54] MANUFACTURE OF A SUSPENDED MICROMECHANICAL ELEMENT

[75] Inventor: Igor I. Bol, Sherman Oaks, Calif.

[73] Assignee: Xerox Corporation, Stamford, Conn.

[21] Appl. No.: 725,176

[22] Filed: Jul. 3, 1991

[51] Int. Cl.[5] .................. B44C 1/22; C03C 15/00; C23F 1/00; H01L 21/306

[52] U.S. Cl. .................. 156/657; 156/656; 156/659.1; 156/662

[58] Field of Search ............ 156/653, 656, 657, 661.1, 156/662, 659.1; 437/228, 233, 238, 241, 245; 310/40 R, 40 MM, 261-268

[56] References Cited

U.S. PATENT DOCUMENTS

| | | | |
|---|---|---|---|
| 4,740,410 | 4/1988 | Muller et al. | 156/656 X |
| 4,997,521 | 3/1991 | Howe et al. | 156/657 X |
| 5,043,043 | 8/1991 | Howe et al. | 156/657 X |

Primary Examiner—William A. Powell

[57] ABSTRACT

A process in which concave surfaces to form undercut edges can be made and the application of such process to making micromechanical devices. Concave surfaces forming undercut edges are made in a wall of a stationary structure extending from a planar surface by growing a convex bumper into the wall. The bumper forms a convexo-concave relationship with the wall. The bumper is then removed from the wall in such a manner as to preserve the concave, undercut surface of the wall. The stationary structure and the planar surface is then further processed by coating with a sacrificial layer, and a structural layer. The structural layer is patterned into a movable structure that is held onto the stationary structure by the curved, undercut edge such as the slot in a slider. Final processing includes removing the sacrificial layer to free the movable structure from the stationary structure.

21 Claims, 6 Drawing Sheets

MANUFACTURE OF A SUSPENDED MICROMECHANICAL ELEMENT

This application is related to applicant's copending U.S. applications Ser. No. 07/725,174 Fabrication Methods for Micromechanical Elements and Ser. No. 07/725,173 Manufacture of a Micromechanical Element with Two Degrees of Freedom filed concurrently herewith.

BACKGROUND OF INVENTION

This invention relates generally to micromechanical elements, such as movable joints, gears, and sliders and more particularly concerns fabrication methods for making high precision micromechanical elements.

Micromechanical elements with joints that slide or rotate have many uses in miniature pin joints, gears, cranks, slides, and other mechanisms. These elements can be made in a variety of ways. In U.S. Pat. No. 4,740,410 by Muller et al., micromechanical sliding or rotating elements are made by following the process steps of:

1) depositing a sacrificial layer of glass on a substrate,
2) depositing and forming a structural layer of polysilicon for the sliders or gears,
3) depositing a second sacrificial layer of glass,
4) depositing and forming a second structural layer of polysilicon for the rails or pins,
5) removing the sacrificial layers to free the gears and sliders from both the substrate and the pins and rails.

This process results in fixed axle pin joints or fixed rail sliders. Once loosened, the fixed gears and sliders rest on the substrate. In operation, undesirable amounts of friction are generated between the gears and sliders, and the substrate.

A process for making self-constraining joints is also disclosed in Muller et. al. Self-constraining joints may slide and rotate at the same time. These joints are constructed using a small variation of the basic process discussed above. The self-constraining joints are differentiated from the fixed joints by constructing a flange on the pins and rails underneath the gears and sliders to keep them in place. The pins and rails can either be fixed to the substrate or left free to slide across the substrate. The pins and rails are constructed using a portion of the normally first sacrificial glass layer to form the pin or rail and the first structural polysilicon layer to form the flange. The flange is formed with an etch undercut process. Etch undercutting processes are in general not easily controllable. The glass/polysilicon joint is also the weakest part of the structure and tends to break under stress.

Further information about this process can also be found in a paper by Muller et al:

"Integrated Movable Micromechanical Structures for Sensors and Actuators", IEEE Transactions on Electron Devices vol. 35, no. 6, June 1988.

SUMMARY OF THE INVENTION

Briefly stated and in accordance with the present invention, there is provided a process for making micromechanical elements that are suspended from the substrate and have a minimal amount of friction.

A first type of sliding or rotating micromechanical element is built on a substrate with a projecting pin or rail and with concave walls. A first structural layer for use as a pin or rail is formed. A sacrificial layer is then formed over the structural layer. The sacrificial layer is thicker on the substrate than on the top of the gear or pin. Then a second structural layer is deposited on the sacrificial layer. After a gear or slider is formed out of the structural layer, the sacrificial layer is etched away releasing the gear from the pin or the slider from the rail. Since the sacrificial layer is thicker on the substrate than on the top of the gear or pin, when the gear or slider is released it will rest on the pin or rail but remain suspended above the substrate.

A second type of gear or slider may also be built with this process. Instead of building a pin which projects outward from the substrate, a depression is formed. The walls of the depression are concave. Again, a sacrificial layer is then formed over the structural layer. The sacrificial layer is thicker on the substrate, at the bottom of the depression, than on the surface of the structural layer. A second structural layer is then deposited on the sacrificial layer and fabricated into a gear or slider. When the sacrificial layer is removed the gear or slider is free to move within the confines of the depression. Again, since the sacrificial layer is thicker on the substrate than on the top of the structural layer, when the gear or slider is released it will rest on the structural layer, but remain suspended above the substrate.

DESCRIPTION OF THE INVENTION

Figure 1:
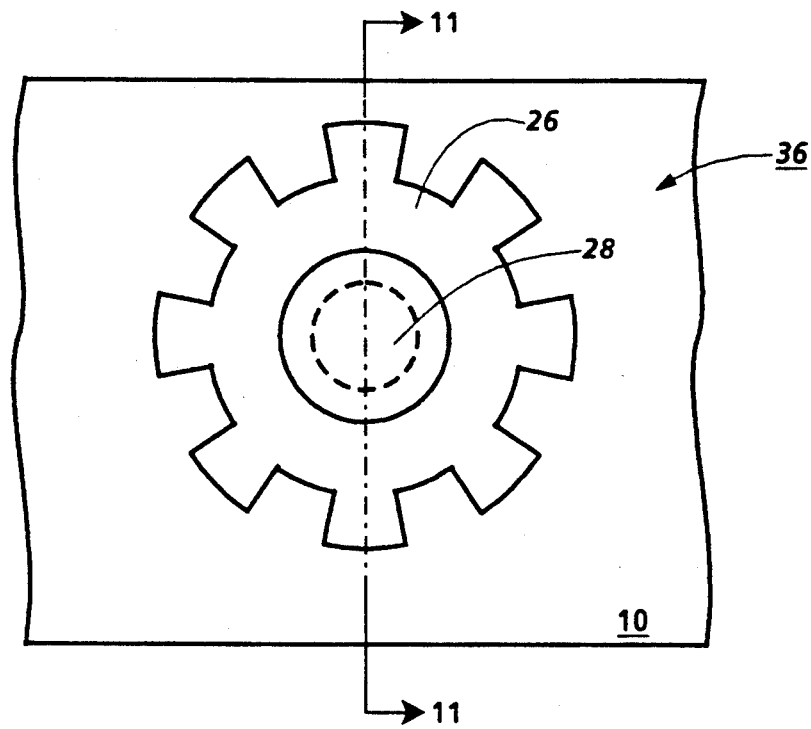
FIG. 1 shows a top view of a gear on a pin.
Figure 2:
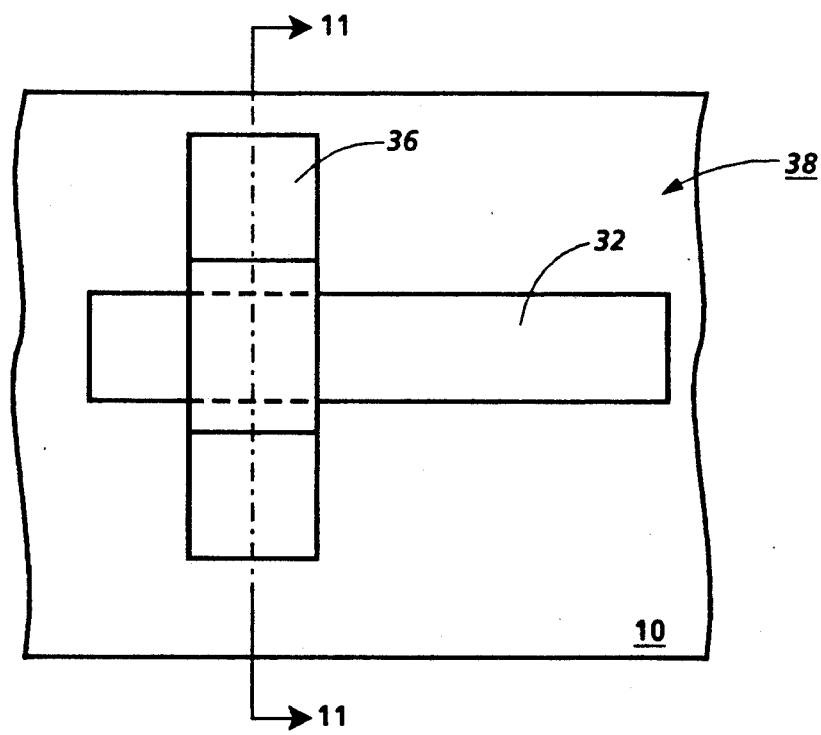
FIG. 2 shows a top view of a slider on a rail.

Turning now to FIG. 1, a top view of a gear 26 rotating around a pin 28 is shown. FIG. 2 depicts a top view of a slider 30 sliding on a rail 32. Both of these structures are built using the same process sequence and have the same cross section as taken through 10—10 and shown in FIG. 10, so they will be described together. All of the process steps for deposition of materials, etching and patterning are known in the art. Therefore, the description will focus on the order and results of each step and not on the specific details required to perform each step.

The micromechanical elements are built upon a substrate. In this embodiment, silicon is used for the substrate. Silicon is ideal since it is not damaged during high temperature process steps. Other materials, such as ceramics or some metals, could be substituted.

Figure 3:
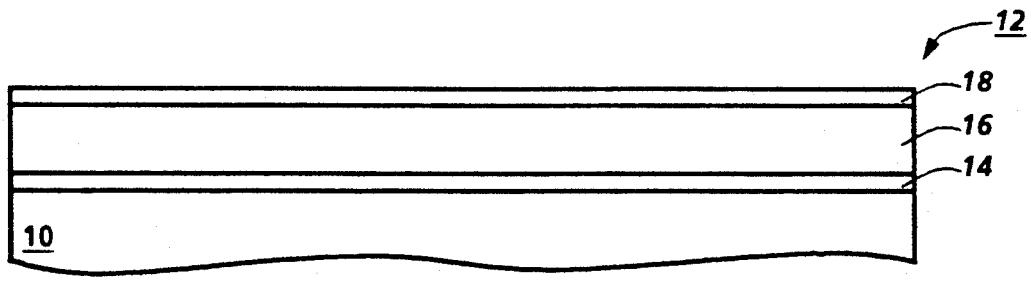
FIG. 3 shows a cross sectional view of a substrate after first and second nitride deposition and doped polysilicon deposition to form a first structural layer.

FIG. 3 illustrates the substrate 10 after depositing a structural layer 12. The structural layer 12 is actually comprised of three layers, a first nitride layer 14, a doped polysilicon layer 16, and a second nitride layer 18.

Figure 4:
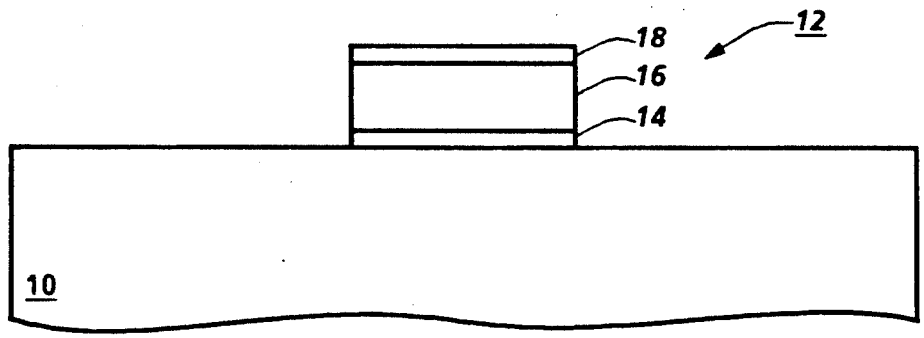
FIG. 4 shows a cross sectional view of the substrate of FIG. 3 after masking and etching the first structural layer.

The structural layer 12 undergoes two phases of patterning. The first is done using a conventional photoresist and etching process. The photoresist is used to define those areas that will become pins and/or rails. Those areas of the structural layer 12 that will not become pins and/or rails are completely etched away. When this step is completed, the remaining structural layer 12 will project or protrude from the surface of the substrate 10 as in FIG. 4. The projecting or protruding remains of the structural layer 12 will later become the pin 28 shown in FIG. 1 or the rail 32 shown in FIG. 2.

Figure 5:
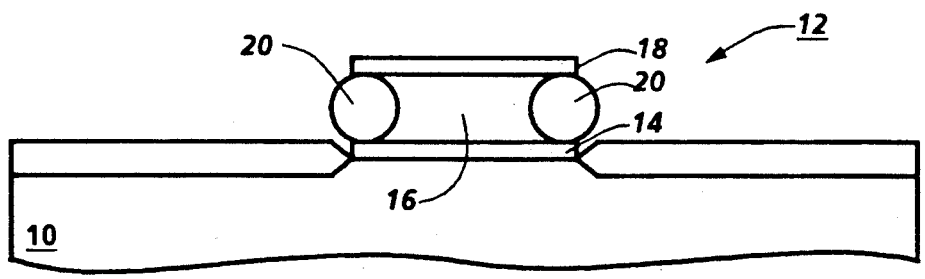
FIG. 5 shows a cross sectional view of the substrate of FIG. 4 after oxide bumpers are grown.

As shown in FIG. 5, the second patterning phase commences with growing oxide bumpers. Oxide bumpers 20 are grown on the doped polysilicon layer 16 using a conventional oxidation process. The oxide grows on the exposed edge or wall of the doped polysilicon layer 16. The oxide bumper 20 grows both inward and outward in a curved shape since the constraints put on it from the first and second nitride layers 14, 18 control the shape of the bumper. The oxidation rate will be slowest at the interface of the doped polysilicon layer 16 with each of the nitride layers 14, 18. The oxide bumpers 20 are grown until the profile of the oxide growth is concvex and forming a convexo-concave relationship with the doped polysilicon layer 16. Oxidation rates can be controlled by changing the dopant profile of the doped polysilicon layer 16 either by ion implantation or by controlling in situ dopant in the doped polysilicon layer 16. Since control of polysilicon oxidation rates is known, the depth and profile of the oxide bumper 20 can be precisely controlled. Therefore, the concave shape of the pin 28 profile shown in FIG. 1 can be precisely controlled. The growth and control of oxide bumpers is discussed in U.S. Pat. Nos. 4,400,866 and 4,375,643 by Bol and Keming, both titled Application of Grown Oxide Bumper Insulators to a High Speed VLSI SASMEFET, incorporated by reference herein.

Figure 6:
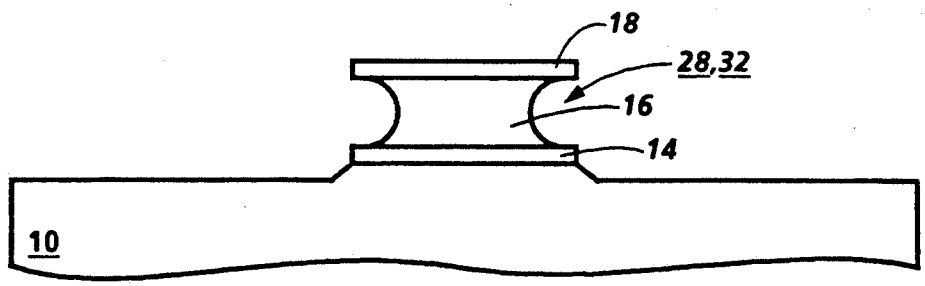
FIG. 6 shows a cross sectional view of the substrate of FIG. 5 after the oxide bumpers have been etched away.

Oxide removal as shown in FIG. 6 is the last step of patterning the first structural layer 12 which has become either the pin 28 or the rail 32 as shown in FIGS. 1 and 2. The convexo-concave relationship of the oxide bumper 20 to the doped polysilicon layer 16 allows construction of a pin 28 or rail 32 with concave sides. Since the oxide bumpers had an convex profile, when they are etched away the resulting wall will have a concave. Any convexo-concave profile, where the oxide bumper 20 bulges outward and the doped polysilicon layer 16 bulges inward, where the head of the pin 28 or rail 32 is larger than the body 31 of the pin 28 or rail 32 will work. Since the pin 28 or rail 32 is wider at the head 29, a gear or slider can be constructed around the pin 28 or rail 32 that will be held on by the head 29 of the pin 28 or rail 32.

Figure 7:
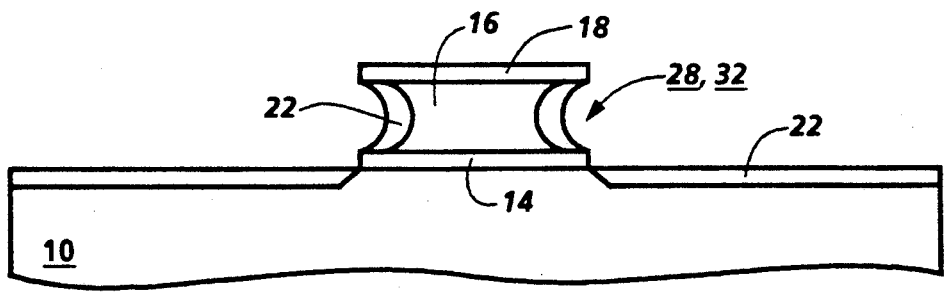
FIG. 7 shows a cross sectional view of the substrate of FIG. 6 after deposition of a first portion of a sacrificial layer.
Figure 8:
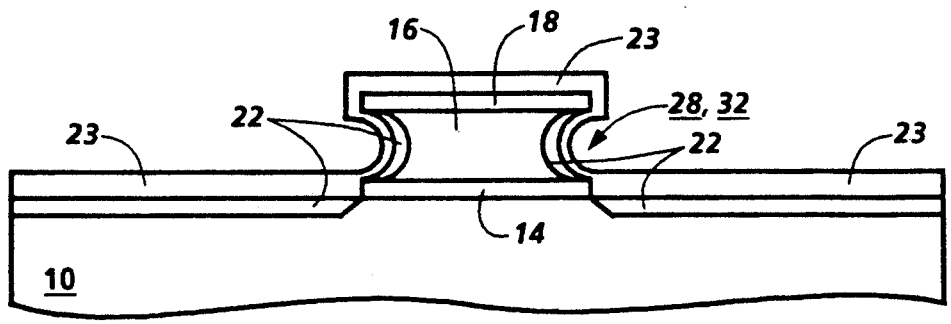
FIG. 8 shows a cross sectional view of the substrate of FIG. 7 after deposition of a second portion of sacrificial layer.

A sacrificial layer 25 (FIG. 9) is formed in two steps. A first portion 22 of the sacrificial layer 25 is shown in FIG. 7. Thermal oxide growth is used to coat the substrate 10 and the surfaces of the pin 28 or rail 32 to form the first portion 22 of the sacrificial layer 25. However, any material may be used which has a sufficiently high etching rate compared to polysilicon, that can withstand the temperatures and processing of the further steps and which conforms to the shape of the pin when deposited. Oxide is grown on the surface of the substrate 10 and the sides of the pin 28 or rail 32, as shown in FIG. 7, which are made from silicon and doped polysilicon respectively. Since the top surface of the pin 28 or rail 32 is nitride, no oxide can be grown thereon. To insure that the whole structure is covered with oxide, a TEOS oxide deposition is used to form a second portion 23 of the sacrificial layer 25 after oxide has been grown on the substrate 10 and the side surfaces of the pin 28 or rail 32 as shown in FIG. 8. The result is that the oxide layer on the top surface of the pin 28 or rail 32 is thinner than the oxide layer on the substrate 10 and the sides of the pin 28 or rail 32, as shown in FIG. 8.

Figure 9:
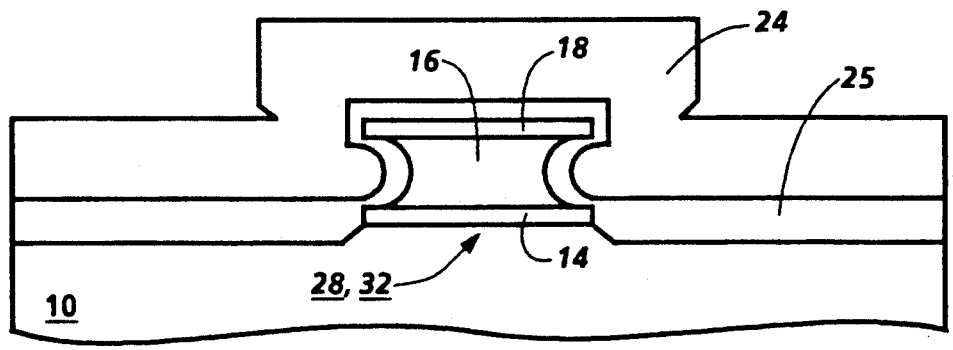
FIG. 9 shows a cross sectional view of the substrate of FIG. 8 after deposition of a second structural layer.

The structure is now ready for formation of the structural layer 24, as shown in FIG. 9. Polysilicon has been used in this embodiment although other materials may be substituted such as silicon, metals, or metal silicides. The structural layer 24 is separated from the pin 28 or the rail 32 and the substrate 10 by the sacrificial layer 22.

Once the structural layer 24 has been deposited it is ready for patterning to be finally formed into either the gear 26 or slider 30 shown in FIGS. 1 and 2. The slider 30, will be slotted to receive the rail 32. Conventional procedures of masking and etching that were used in previous steps to pattern the structural layer 12 are used again here to pattern the structural layer 24.

Figure 10:
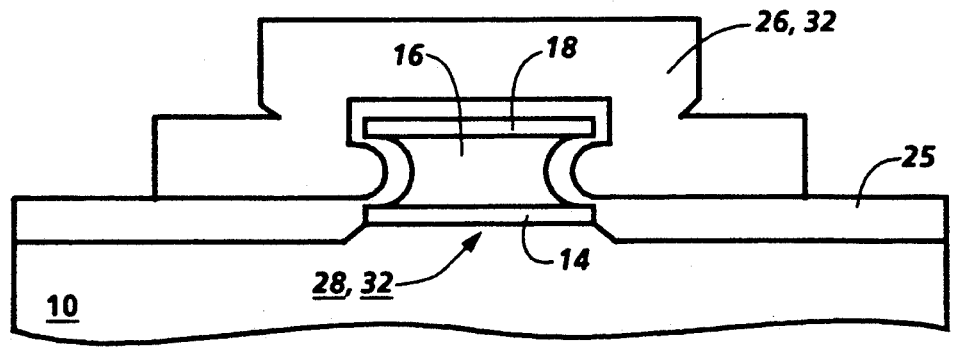
FIG. 10 shows a cross sectional view of the substrate of FIG. 9 after patterning the structural layer.

FIG. 10 shows the device after patterning the structural layer 24. The gear 26 or slider 30 is now completed but still connected by the sacrificial layer 22 to the substrate 10 and the pin 28 or the rail 32.

Figure 11:
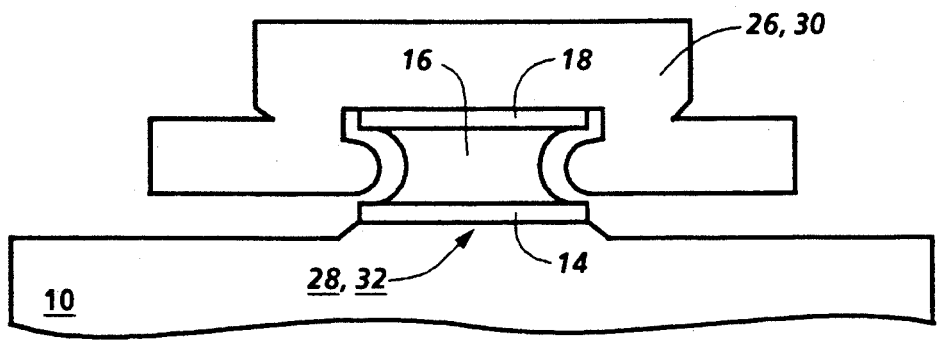
FIG. 11 is a cross sectional view of the completed gear shown in FIG. 1 or the completed slider shown in FIG. 2 taken through section line 11—11.

The final step, shown in FIG. 11, is removal of the sacrificial layer 22. In this embodiment an oxide etch is used to wash out the oxide used for the sacrificial layer 22. This step frees the gear 26 or slider 30 from the pin 28 or rail 32 and the substrate 10. The gear 26 may now rotate freely around the pin 28 and the slider 30 may now slide freely on the rail 32.

Since the sacrificial layer 22 was thicker on the sides of the pin 28 or rail 32 and the substrate 10, when the sacrificial layer 22 is etched away the gear 26 or slider 30 will rest on the pin 28 or rail 32 but will be suspended above the substrate 10 and constrained by, but separated from, the head 29 and body 31 of the pin 28 or rail 32. Having the gear 26 or the slider 30 held suspended above the substrate 10 eliminates the frictional component between the gear 26 and substrate 10 when in use.

Since silicon is capable of oxidation, Providing a thicker sacrificial layer on the substrate than on the top of the pin 28 or rail 32 to produce a gear or slider that is suspended above the substrate is made possible since silicon is capable of oxidation.

An alternative embodiment would be to use only the TEOS deposition for formation of the sacrificial layer. In order to achieve a sacrificial layer that is thinner on the surface of the pin 28 or rail 32 the deposited oxide could be selectively etched only on the surface of the pin 28 or rail 32. This could be done using conventional masking and etching techniques.

A second embodiment may also be built and is shown in FIGS. 12-20. Equivalent parts of FIGS. 3-10 are given the same reference numbers only with "a" affixed thereto. The sequence will also be used to illustrate changes to the process when a substrate that does not form an oxide is used.

Figure 12:
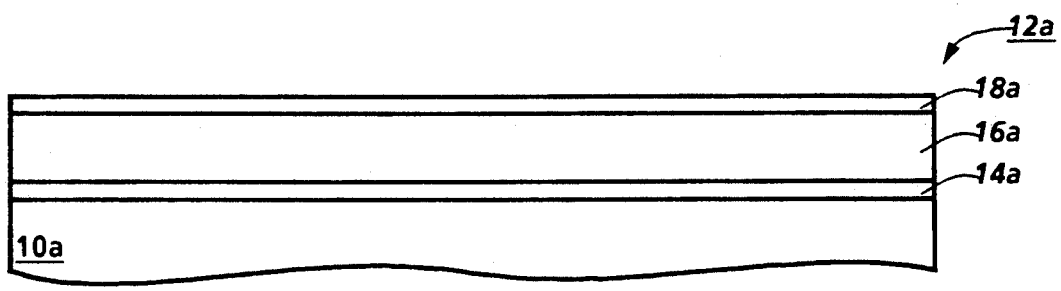
FIG. 12 shows a cross sectional view of a substrate after first and second nitride deposition and doped polysilicon deposition to form a first structural layer.

FIG. 12 is identical to FIG. 3 in that it illustrates the substrate after deposition of the structural layer 12a which will be patterned to form the recessed pins and/or rails.

Figure 13:
FIG. 13 shows a cross sectional view of the substrate of FIG. 12 after masking and etching the first structural layer.

FIG. 13 illustrates the first patterning phase. In contrast to FIG. 4, a depression has been defined in the first structural layer. However, the nitride layer 14a has been left on the surface of the substrate 10a. There is no reason to remove the nitride layer 14a since in this embodiment the surface of the substrate 10a is not does not form an oxide. This hole will later become the recessed pin or rail.

Figure 14:
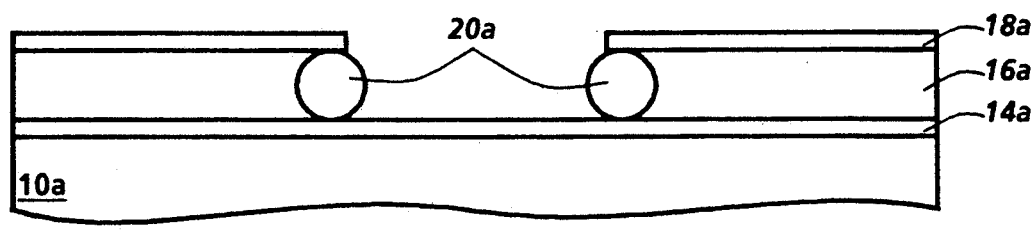
FIG. 14 shows a cross sectional view of the substrate of FIG. 13 after oxide bumpers are grown.
Figure 15:
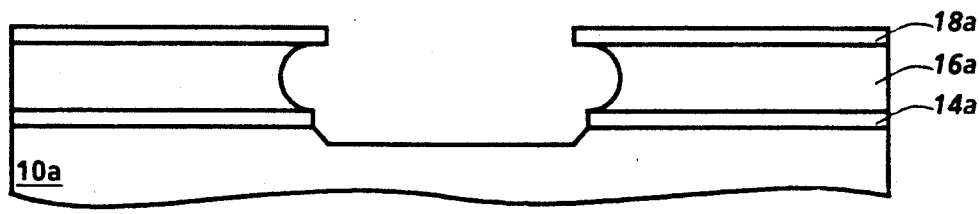
FIG. 15 shows a cross sectional view of the substrate of FIG. 14 after the oxide bumpers have been etched away.

Oxide bumpers are grown and removed in FIGS. 14 and 15 identically as in FIGS. 5 and 6. The result is a recessed pin 28a or rail 32a formed by the hole in the first structural layer 12a.

Figure 16:
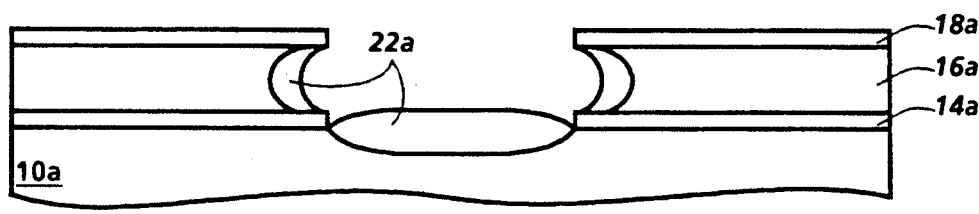
FIG. 16 shows a cross sectional view of the substrate of FIG. 15 after formation of a first portion of a sacrificial layer.
Figure 17:
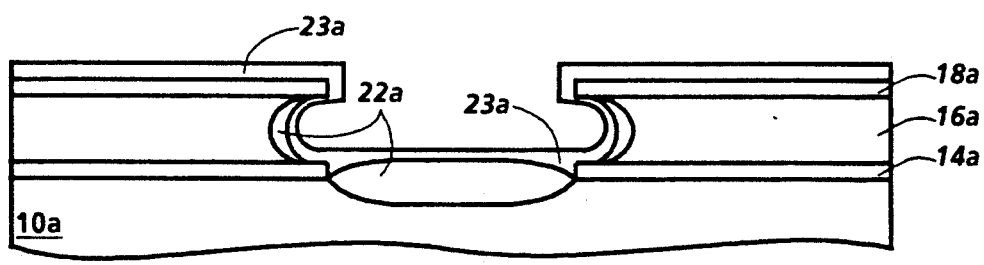
FIG. 17 shows a cross sectional view of the substrate of FIG. 16 after formation of a second portion of a sacrificial layer.

The next step is forming a sacrificial layer 2a as shown in FIG. 16 and 17. This is done using an identical process to FIGS. 7 and 8.

Figure 18:
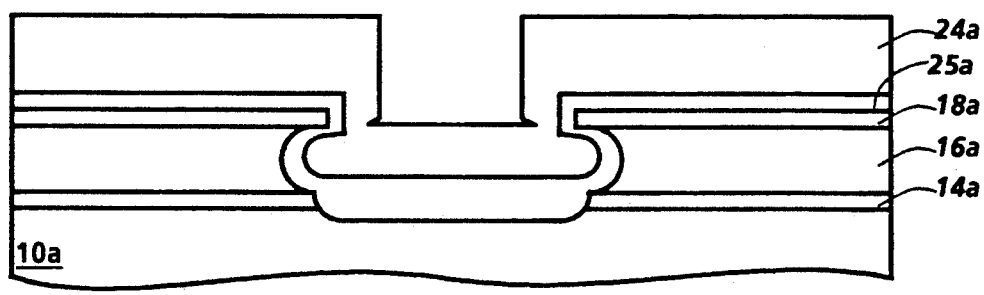
FIG. 18 shows a cross sectional view of the substrate of FIG. 17 after deposition of a second structural layer.
Figure 19:
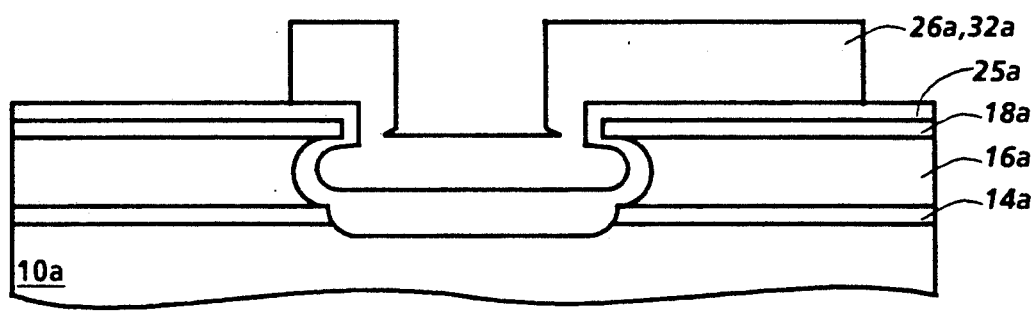
FIG. 19 shows a cross sectional view of the substrate of FIG. 18 after patterning the structural layer.

Deposition and patterning of the second structural layer 24a, as shown in FIGS. 18 and 19 is identical to FIGS. 9 and 10.

Figure 20:
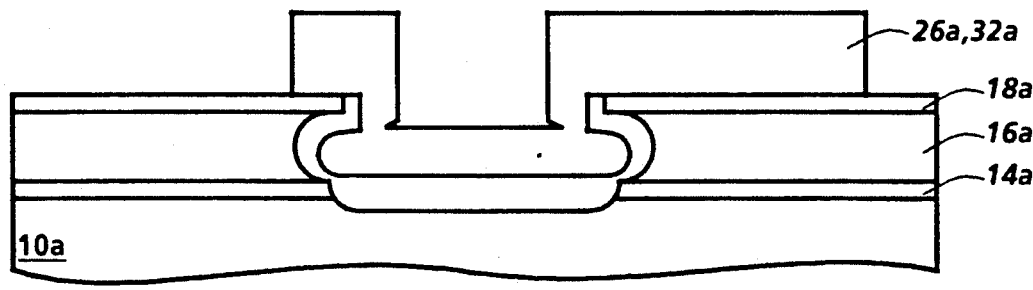
FIG. 20 is a cross sectional view of a completed gear from the sequence of process steps shown in FIGS. 13-19 after the sacrificial layer has been removed.

The final step, shown in FIG. 20, is an oxide etch to wash out the sacrificial layer 25a. This step frees the gear 26a or slider 30a from the recessed pin 28a or recessed rail 32a and the substrate 10a. The gear 26a may now rotate freely around the recessed pin 28a and the slider 30a may now slide freely on the recessed rail 32a.

Utilizing layers of gears and sliders allows complicated micromechanical structures with interlocking gears and sliders to be built. Self-constraining structures, based on sliding gears interacting with other gears or sliders, can be built.

What is claimed is:

1. A process for making a micromechanical device on a member comprising:
   providing a member having a first generally planar surface and a second generally planar surface extending generally parallel to said first generally planar surface,
   wall means extending between and joining said first and second generally planar surfaces,
   said wall means having a generally concave surface,
   forming a first sacrificial layer on said wall means and at least a portion of said first generally planar surface,
   forming a second sacrificial layer on top of said first sacrificial layer and on at least a portion of said second generally planar surface so the second sacrificial layer on said second generally planar surface is thinner than the combined first and second sacrificial layers on said first generally planar surface,
   forming a structural layer on top of at least a portion of said second sacrificial layer, and
   patterning said structural layer to form a moving structure for movement relative to said member and exposing portions of said sacrificial layer, and
   etching and removing said first and second sacrificial layers to release said moving structure from said member and providing relative movement between said moving structure and said member, whereby said moving structure is spaced from said first generally planar surface and contacts said second generally planar surface.

2. The process of claim 1, wherein:
   said first sacrificial layer is formed by being grown on said wall means and at least a portion of said first generally planar surface, and
   said second sacrificial layer is formed by being deposited onto the top of said first sacrificial layer and said second generally planar surface.

3. The process of claim 2, wherein:
   the member is a silicon wafer,
   the portion between said first and second generally planar surfaces is polysilicon,
   said second generally planar surface is nitride,
   said first sacrificial layer is oxide, and
   said second sacrificial layer is oxide deposited by the TEOS process.

4. The process of claim 3, wherein said first generally planar surface is nitride.

5. The process of claim 1, wherein said wall means is on a structure protruding from said first generally planar surface and said second generally planar surface is on the protruding structure.

6. The process of claim 5, wherein said wall means is annular and said structural layer has an annular recessed cavity receiving said protruding structure.

7. The process of claim 5, wherein said protruding structure is elongated and said structural layer has a slot receiving said protruding structure.

8. The process of claim 1, wherein said wall means and said first generally planar surface defines a depression and said second generally planar surface surrounds the depression.

9. The process of claim 8, wherein said wall means is annular.

10. The process of claim 8, wherein said wall means is elongated.

11. The process of claim 1, wherein said first sacrificial layer comprises one of silicon oxide or silicon nitride and said structural layer comprises one of polysilicon, silicon nitride, metal silicide, or metal.

12. A process for making a micromechanical device on a member comprising:
   providing a member having a first generally planar surface;
   masking and etching said first generally planar surface and said member to expose at least a second generally planar surface of said member and to form a structure with at least one wall means protruding from said second generally planar surface of said member;

forming bumper means into said wall means of said protruding structure and forming a convexo-concave relationship with said wall means;

etching said bumper means to remove the same from said wall means of said protruding structure while retaining the concave surface of said wall means;

forming a first sacrificial layer on said wall means and at least a portion of said second generally planar surface of said member;

forming a second sacrificial layer on top of said first sacrificial layer and on at least a portion of said first generally planar surface so the second sacrificial layer on said first generally planar surface is thinner than the combined first and second sacrificial layers on said second generally planar surface;

forming a structural layer on at least a portion of said second sacrificial layer;

patterning said structural layer to form a moving structure for movement relative to said protruding structure and exposing portions of said sacrificial layers; and etching and removing said first and second sacrificial layers to release said moving structure from said protruding structure and providing relative movement between said moving structure and said protruding structure, whereby said moving structure is spaced from said second generally planar surface and contacts said first generally planar surface.

13. The process of claim 12, wherein:
said member is a silicon wafer,
said bumper means is oxide,
the portion between said first and second generally planar surfaces is polysilicon,
said first generally planar surface is nitride,
said first sacrificial layer is oxide, and
said second sacrificial layer is oxide deposited by the TEOS process.

14. The process of claim 13, wherein said second generally planar surface is nitride.

15. The process of claim 12, wherein said wall means is annular and said structural layer has an annular recessed cavity receiving said protruding structure.

16. The process of claim 12, wherein said protruding structure is elongated and said wall means is elongated said structural layer has a slot receiving said protruding structure.

17. A process for making a micromechanical device on a member comprising:

providing a member having a first generally planar surface;

masking and etching said first generally planar surface and said member to expose a second generally planar surface of said member and to form a depression in said member which is defined by wall means and said second generally planar surface;

forming bumper means into said wall means of said depression and forming a convexo-concave relationship with said wall means;

etching said bumper means to remove the same from said wall means of said depression while retaining the concave surface of said wall means;

forming a first sacrificial layer on said wall means and at least a portion of said second generally planar surface of said member;

forming a second sacrificial layer on top of said first sacrificial layer and onto at least a portion of said first generally planar surface so the second sacrificial layer on said first generally planar surface is thinner than the combined first and second sacrificial layers on said second generally planar surface;

forming a structural layer on at least a portion of said second sacrificial layer;

patterning said structural layer to form a moving structure for movement relative to the structure forming said depression and exposing portions of said sacrificial layers; and etching and removing said first and second sacrificial layers to release said moving structure from the structure forming said depression and providing relative movement between said moving structure and the structure forming said depression, whereby said moving structure is spaced from said second generally planar surface and contacts said first generally planar surface.

18. The process of claim 17, wherein:
said member is a silicon wafer,
said bumper means is oxide,
the portion between said first and second generally planar surfaces is polysilicon,
said first generally planar surface is nitride,
said first sacrificial layer is oxide, and
said second sacrificial layer is oxide deposited by the TEOS process.

19. The process of claim 18, wherein said second generally planar surface is nitride.

20. The process of claim 19, wherein said wall means is annular.

21. The process of claim 19, wherein said wall means is elongated.

* * * * *